(12) United States Patent
Chen et al.

(10) Patent No.: US 6,458,612 B1
(45) Date of Patent: Oct. 1, 2002

(54) METHOD OF FABRICATING HIGH EFFICIENCY LIGHT-EMITTING DIODE WITH A TRANSPARENT SUBSTRATE

(75) Inventors: Tzer-Perng Chen, Hsinchu; Chih-Sung Chang, Taipei; Shu-Woei Chiou, Miaoli, all of (TW)

(73) Assignee: United Epitaxy Company, Inc., Hsinchu (TW)

( * ) Notice: Subject to any disclaimer, the term of this patent is extended or adjusted under 35 U.S.C. 154(b) by 0 days.

(21) Appl. No.: 09/955,168

(22) Filed: Sep. 19, 2001

(30) Foreign Application Priority Data

Sep. 19, 2000 (TW) ........................................ 89119280 A

(51) Int. Cl.[7] .............................................. H01L 21/00
(52) U.S. Cl. ...................................................... 438/29
(58) Field of Search ............................... 438/29, 22–28, 438/46–47, 30–45, 800; 324/767

(56) References Cited

U.S. PATENT DOCUMENTS 4,442,402 A * 4/1984 Besomi et al. .............. 324/767

* cited by examiner

Primary Examiner—Craig Thompson
(74) Attorney, Agent, or Firm—Sughrue Mion, PLLC

(57) ABSTRACT

A method for fabricating high efficiency light-emitting diode (LED) adhered to a transparent substrate is disclosed. To begin with, forming a semiconductor substrate, is followed by sequentially forming an etching stopper, a first type ohmic contact layer, a double heterostructure and a second ohmic contact layer. Afterwards, the transparent substrate, such as preferably glass, is adhered onto the second ohmic contact layer and then the GaAs substrate is removed away. After that, the first type cladding layer and the undoped active layer is etched in turn by using the second type ohmic contact layer as the etching stopper. Finally, a first electrode is formed on the first type ohmic contact layer and a second electrode is formed on the second type ohmic contact layer, respectively. The present invention utilizes some features, such as high transmittance and lower absorptivity, of the glass adhered to the second ohmic contact layer to visible light for increasing luminous intensity of the LED. Moreover, the absorption of visible light of the GaAs substrate can be significantly improved by decreasing the use of the GaAs material.

20 Claims, 4 Drawing Sheets

METHOD OF FABRICATING HIGH EFFICIENCY LIGHT-EMITTING DIODE WITH A TRANSPARENT SUBSTRATE

FIELD OF THE INVENTION

The present invention relates to a method for forming high efficiency light-emitting diode (LED), and more particularly, to a method for fabricating high efficiency light-emitting diode adhered to a transparent substrate, such as the material of glass.

BACKGROUND OF THE INVENTION

A light-emitting diode (LED) is an important optoelectronic device which is widely used in various products such as electronic devices, advertising signs and electrical appliance to indicate the related messages or to sharpen the beauty of a product. Additionally, the utilization of the LEDs has been gradually expanding to all kinds of application. The high brightness becomes a significant index level of the superior quality LEDs besides true color and duration of the LEDs.

Referring to FIG. 1A, GaAs is used as a semiconductor substrate for the LEDs. To begin with, a double heterostructure 110 is formed on a GaAs substrate 10 wherein the double heterostructure 110 comprises a N-type cladding layer of AlGaInP 11, an active layer of AlGaInP 12 and a P-type cladding layer of AlGaInP 13, and a transparent layer 14 on the P-type cladding layer of AlGaInP 13. Since the energy band gap of the GaAs substrate 10 is less than that of the active layer of AlGaInP 12, the energy band gap of the GaAs substrate 10 lies in the range of the visible light. Consequently, the specific wavelengths of visible light, induced from the double heterostructure 110, may be absorbed by the GaAs substrate 10 which results in brightness degradation of the LED.

Referring to FIG. 1B, GaP is used as a semiconductor substrate for the LEDs. A double heterostructure 110 is formed on a GaP substrate 15 wherein the double heterostructure 110 comprises a N-type cladding layer of AlGaInP 11, an active layer of AlGaInP 12 and a P-type cladding layer of AlGaInP 13, and a transparent layer 14 on the P-type cladding layer of AlGaInP 13. Since the GaP may induce a light-emitting absorption in the range of spectrum (yellow and green), the conventional material is no more than applied to the use of some particular wavelength of LED.

Referring to FIG. 2, a Bragg reflector is applied on a GaAs semiconductor substrate. A Bragg reflector 21 formed on the GaAs substrate 10 and the double heterostructure 110 is formed on a GaAs substrate 20 wherein the double heterostructure 110 comprises an N-type cladding layer of AlGaInP 11, an active layer of AlGaInP 12 and a P-type cladding layer of AlGaInP 13, and a transparent layer 14. The material of the Bragg reflector 21 is GaAs/AIAs having a coefficient 3.4 Although the Bragg reflector 21 can partially eliminate the absorption of the light emitted from the double heterostructure 110 to prevent the light-emitting from being absorbed by the GaAs substrate 10. Unfortunately, the Bragg reflector 21 may increase the complexity of the process and thus largely spend a great of epitaxy time during manufacture process. Also, the sufficient thickness of the Bragg reflector 21 is needed, even so, the Bragg reflector 21 can not completely solve the light-emitting absorption problem by the GaAs substrate 10.

Consequently, a conventional method for fabricating a LED according to the above involves some disadvantages as follows: (a) the visible light, emitted from the double heterostructure, will be absorbed by the GaAs substrate and result in a great deal of the light-emitting efficiency reduction; (b) a conventional material, GaP compound material, for a transparent layer may incur the absorption of some specific wavelength band (yellow or green) so that the transparent layer is only used in the particular range of the spectrum; and (c) the Bragg reflector may obviouly increase the manufacturing time and the production cost, especially, when multiple Bragg reflector layers are used.

SUMMARY OF THE INVENTION

The primary object of the present invention is to provide a new method of fabricating high efficiency light-emitting diode (LED) adhered to a transparent substrate, preferably a glass adhered thereon by heat and to overcome the drawback of the lower light-emitting efficiency regarding the conventional LED.

In the preferred embodiment of the present invention, to begin with, providing a semiconductor substrate is followed by forming an etching stopper, a first type ohmic contact layer, a double heterostructure and then a second ohmic contact layer. The double heterostructure comprises a N-type cladding layer of AlGaInP, an active layer of AlGaInP and a P-type cladding layer of AlGaInP. Afterwards, a transparent substrate, such as preferably glass, which is visible in the range of visible light, is adhered to the second ohmic contact layer and then the GaAs substrate is removed away. The first type cladding layer and the undoped active layer are etched, wherein the second type ohmic contact layer is used as the etching stopper. The first electrode is formed on the first type ohmic contact layer and the second electrode is formed on the second type ohmic contact layer, respectively.

As a result, the present invention utilizes some features, for example, high transmittance and lower absorptivity, of the glass adhered to the second ohmic contact layer to visible light for increasing luminous intensity of the LED. Taking advantage of glass in strength and machining, the surface of the glass is easily roughed so that the total reflection inside the glass is entirely blocked while the photons are transmitted from the LED therethrough. Moreover, the absorption of the GaAs substrate for the visible light is significantly improved by appropriately decreasing the use of the GaAs material.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In view of the above description regarding fabrication of a conventional LED, it has been encountered with various problems all the time. The present invention provides an effective solution to solve these problems. In the present invention, a method of fabricating a high efficiency light-emitting diode with a transparent substrate layer thereon is disclosed.

Figure 1A:
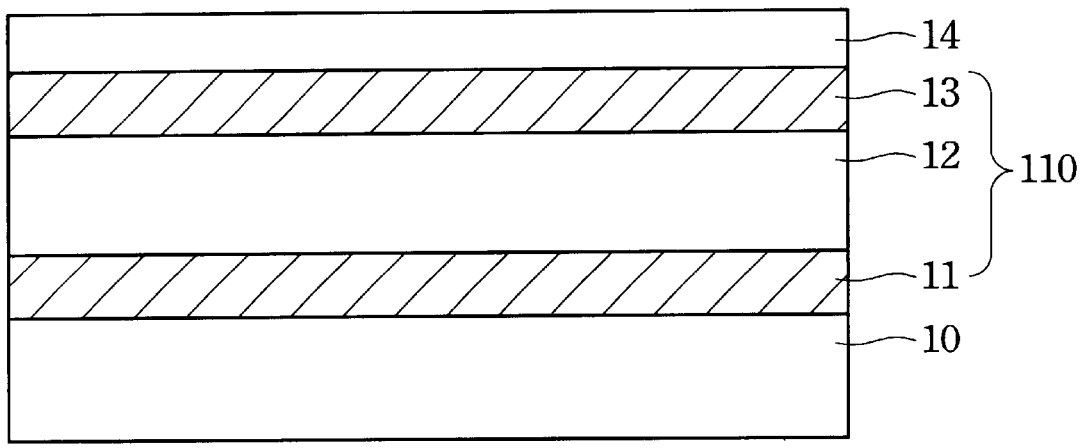
FIG. 1A is cross-sectional view of a prior art LED using GaAs as a semiconductor substrate.
Figure 1B:
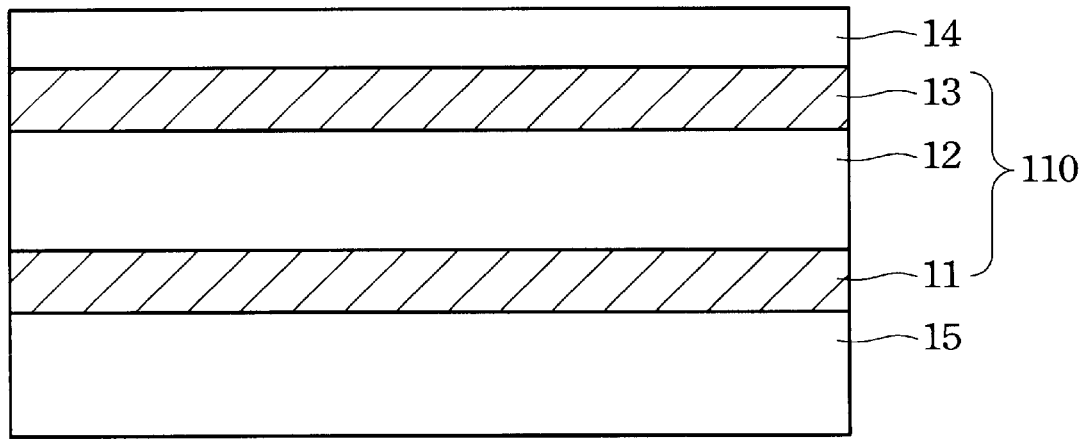
FIG. 1B is cross-sectional view of a prior art LED using GaP as a semiconductor substrate.
Figure 2:
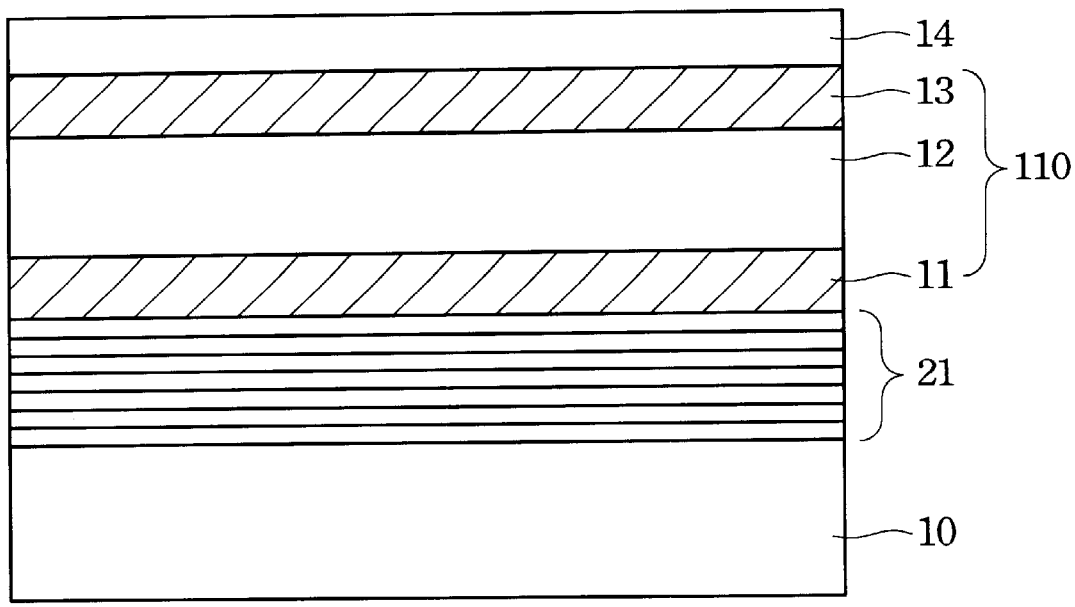
FIG. 2 is cross-sectional view of a prior art LED applying Bragg reflector on a semiconductor substrate.
Figure 3:
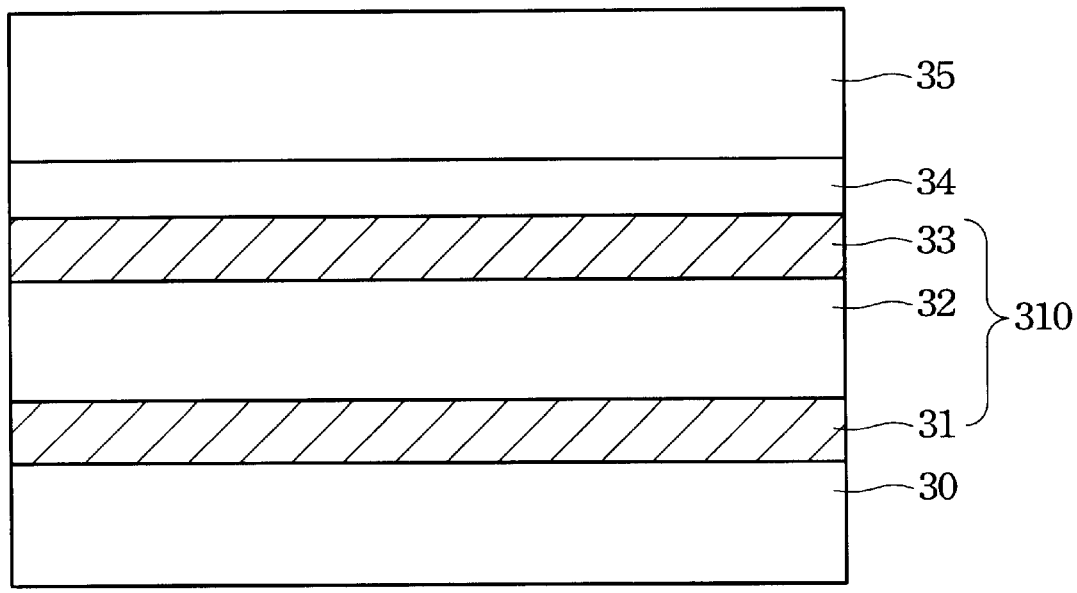
FIG. 3 illustrates glass adheres to the second ohmic contact layer according to the present invention.

Referring now to FIG. 3, a glass is adhered to the second ohmic contact layer according to the present invention. In the preferred embodiment of the present invention, an etching stopper (not shown), a first type ohmic contact layer (not shown) and a double heterostruicture 310 are sequentially formed on a first type GaAs substrate 30. The double heterostructure 310 essentially comprises a first type cladding layer 31, such as AlInP, an undoped active layer 32, such as AlInP, and a second cladding layer 33, such as AlInP. A second type ohmic contact layer 34, such as GaP, GaAs and transparent electrode layer, is formed on the second cladding layer 33.

Finally, a transparent substrate layer 35 is adhered or mounted on the second ohmic contact layer 34. The lucid property of the transparent substrate layer 35, such as the glass having the material of silicon oxide ($SiO_x$), sapphire and GaP, is visible in the range of visible light. Due to the features, such as high transmittance and lower absorptivity of the photons through the glass, the transparent adhered glass by heat on the second ohmic contact layer 34 can substantially enhance the light-emitting efficiency of the LED to the utmost. Moreover, the adhering technique may be easily implemented so as to be beneficial to the process for sticking glass on the second ohmic contact layer 34.

If the first type materials above is N-type, then the second type is P-type. On the contrary, if the first type is P-type, then the second type is N-type. The preferred dopants of the N-type are silicon (Si) or tellurium (Te), and the preferred dopants of the P-type are zinc (Zn) or magnesium (Mg). The undoped active layer 32 of the double heterostructure 310 may be preferably represented by the formula: $((Al_xGa_{1-x})_y In_{1-y}P)$ where $0 \leq x \leq 1$ and $0 \leq y \leq 1$. Most importantly, $0 \leq x \leq 0.5$ and $0.3 \leq y \leq 0.7$ are the best practice for x, y.

The injected current, generated uniformly from the double heterostructure 310, is forced to stay within the first cladding layer 31 and the second cladding layer 33 so that the photons within the undoped active layer 32 is concentrated in the double heterostructure 310 to enhance the light-emitting efficiency of LEDs. The light is controlled by the ratio and by the type of the double heterostructure 310 compound material to form the difference of the energy band gap between the difference composition.

Moreover, the second ohmic contact layer 34, for example GaP, is used to completely avoid the oxidation phenomenon owing to aluminum (Al) within the second cladding layer 33 for a better glass-adhered by heat. Since a large proportion of Al is easily oxidized during adhering process, it will damage the structure between the glass and the double heterostructure 310 or downgrade the light-emitting efficiency of the glass.

Figure 4:
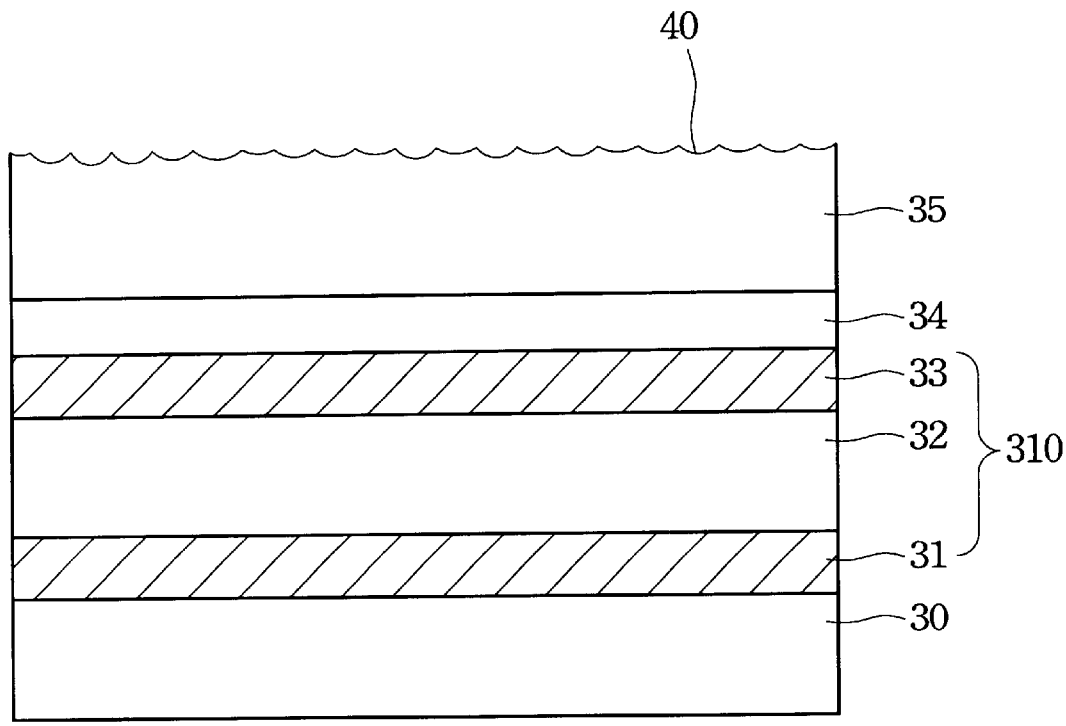
FIG. 4 illustrates the surface of the glass is completely roughed according to the present invention.

Referring to FIG. 4, the surface of the glass layer is completely roughed according to the present invention. Due to the advantage of glass in strength and machining, the glass is roughed with ease by gravel-sprayed to form a coarse surface 40 of the glass such that the total reflection is completely avoided when the light is transmitted from the glass layer therethrough. In other word, it can successfully help launch the photons from the double heterostructure 310 to the outer surroundings. Alternatively, the transparent substrate 35 can be roughed by a chemical etching process.

Figure 5:
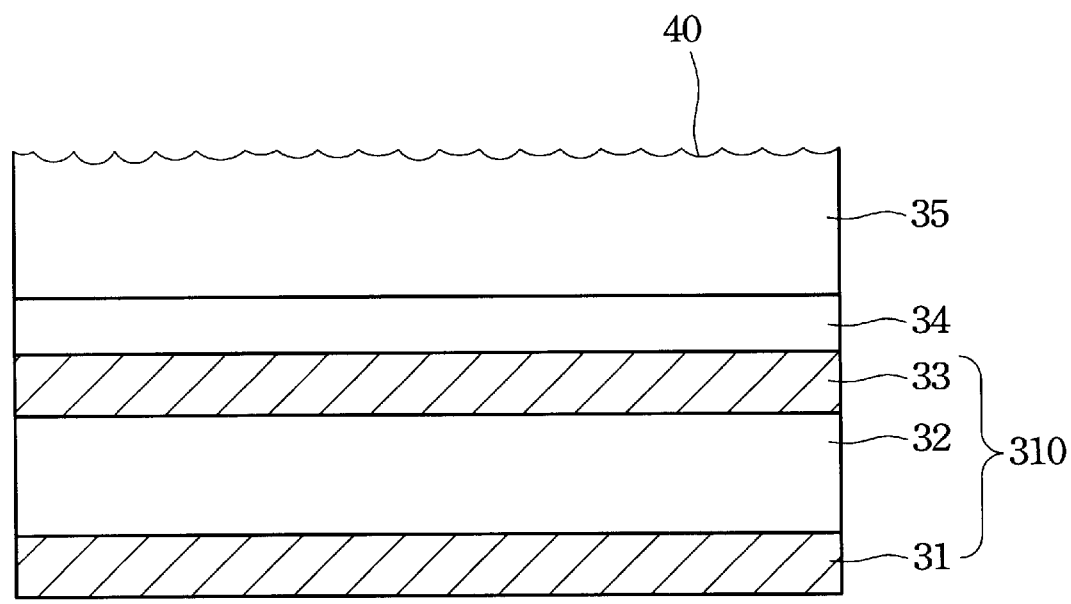
FIG. 5 illustrates the GaAs layer is entirely removed according to the present invention.

Referring to FIG. 5, the GaAs substrate is entirely removed away according to the present invention. The GaAs substrate 30 is removed to prevent the visible light from being absorbed by the GaAs substrate 30. The light-emitting from the double heterostructure 310 is mostly absorbed by the GaAs substrate 30 since the energy band gap of the GaAs substrate 30 is less than that of the double heterostructure 310 leading to the reduction of the light-emitting efficiency of the LED.

Figure 6:
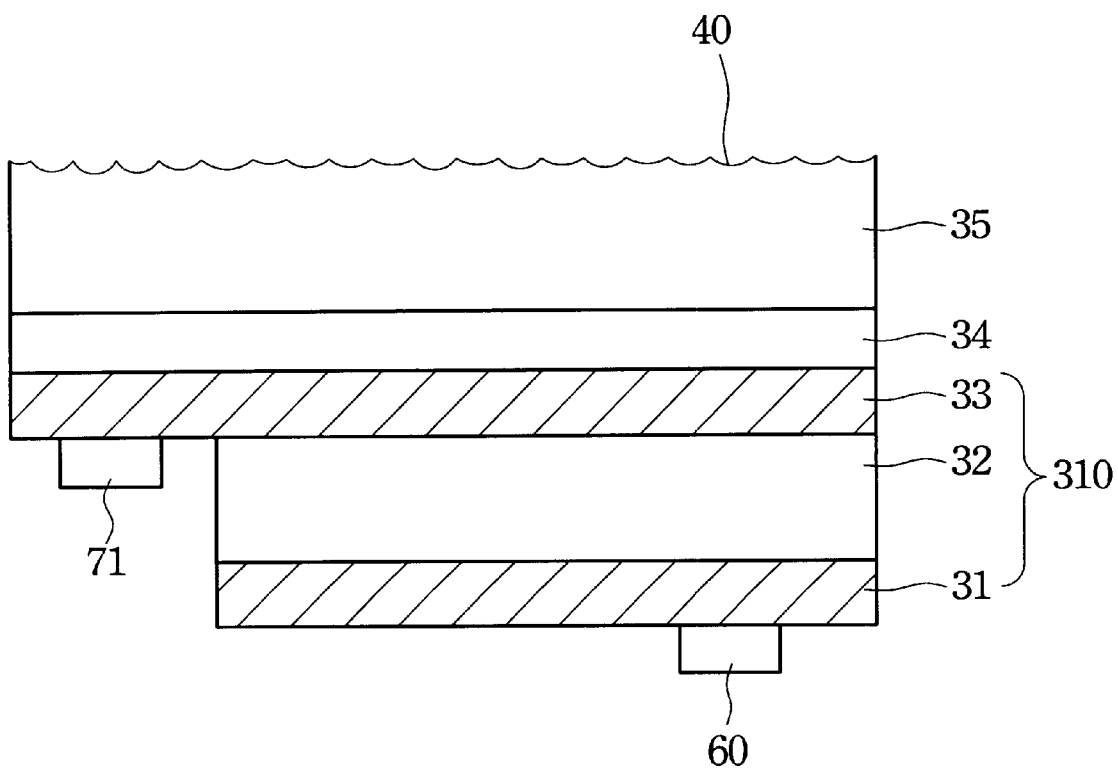
FIG. 6 illustrates the formation of electrode in contact with the lead frame by a bonding wire according to the present invention.

Referring to FIG. 6, the formation of electrode in contact with the lead frame by a bonding wire according to the present invention is shown. The first type cladding layer 31, the second cladding layer 33 and the undoped active layer 32 are etched by using the second type ohmic contact layer 34 as an etching stopper. A second electrode 61 is formed on the second type ohmic contact layer 34, and a first electrode 60 is formed on the first type ohmic contact layer 31. Packaging technology, for example, flip chip techniques, is used to connect the first electrode 60 and the second electrode 61 with the lead frame separately. Therefore, the light-emitting efficiency of the LED is effectively increased and the manufacturing process is also simplified.

In summary, the present invention related to a method for fabricating a high efficiency light-emitting diode with a transparent substrate comprises the benefits of: (1) the removal of the GaAs substrate to prohibit the GaAs from absorbing light-emitting to increase the brightness of LEDs; (2) using the features of high transmittance and lower absorptivity of the photons through the glass adhered to the second ohmic contact layer to increasing luminous intensity of LEDs; (3) taking advantage of glass in strength and machining which the surface of the glass is easily roughed so that the total reflection inside the glass is entirely avoided when the photons are transmitted from the LED therethrough; (4) the absorption of the GaAs for the visible light which is significantly improved by appropriately decreasing the use of the GaAs material; and (5) the first electrode and the second electrode are simultaneously formed, and then use flip chip techniques to connect the first electrode and the second electrode with the lead frame respectively such that the light-emitting efficiency of the LED is effectively increased and the manufacturing process is also considerably simplified.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of fabricating a high efficiency light-emitting diode, comprising the steps of:

forming a first type ohmic contact layer on a semiconductor substrate;

forming a double heterostructure on said first type ohmic contact layer wherein said double heterostructure having a first type cladding layer, an undoped active layer and a second type cladding layer;

forming a second type ohmic contact layer on said second type cladding layer;

adhering a transparent subtrate to said second type ohmic contact layer;

performing an etching step to remove said semiconductor substrate;

etching said first type cladding layer and said undoped active layer by using said second type ohmic contact layer as an etching stopper;

forming a first electrode on said first type ohmic contact layer; and forming a second electrode on said second type ohmic contact layer.

2. The method of claim 1, wherein said second type is P-type if said first type is N-type.

3. The method of claim 1, wherein said second type is N-type if said first type is P-type.

4. The method of claim 1, wherein said semiconductor substrate comprises a material of GaAs.

5. The method of claim 1, wherein said first type cladding layer comprises a material of AlGaInP.

6. The method of claim 1, wherein said second type cladding layer comprises a material of AlGaInP.

7. The method of claim 1, wherein said undoped active layer comprises a material of AlGaInP.

8. The method of claim 7, wherein said AlGaInP comprises an $((Al_xGa_{1-x})_yIn_{1-y}P)$ compound with $0 \leq x \leq 1$ and $0 \leq y \leq 1$.

9. The method of claim 1, wherein said transparent substrate is the one selected a group consisting of glass, sapphire and GaP which are visible in the range of visible light.

10. The method of claim 1, further comprising a roughing step for the surface of said transparent substrate layer after said transparent substrate layer is adhered to said second ohmic contact layer.

11. The method of claim 10, wherein said roughing step is the one selected a group consisting of a gravel-sprayed technique and chemical etching.

12. A method of fabricating a high efficiency light-emitting diode, comprising the steps of:

sequentially forming a first type ohmic contact layer and a double heterostructure on a semiconductor substrate wherein said double heterostructure having a first type cladding layer, an undoped active layer and a second type cladding layer;

forming a second type ohmic contact layer on said second type cladding layer;

forming a transparent substrate on said second ohmic contact layer by hot-adhering technique;

roughing said transparent substrate to acquire a rugged surface;

performing an etching step to remove said semiconductor substrate;

etching said first type cladding layer and said undoped active layer by using said second type ohmic contact layer as an etching stopper;

forming a first electrode on said first type ohmic contact layer; and forming a second electrode on said second type ohmic contact layer.

13. The method of claim 12, wherein said second type is P-type if said first type is N-type.

14. The method of claim 12, wherein said second type is N-type if said first type is P-type.

15. The method of claim 12, wherein said semiconductor substrate comprises a material of GaAs.

16. The method of claim 12, wherein said first type cladding layer comprises a material of AlGaInP.

17. The method of claim 12, wherein the step of roughing said transparent substrate layer is the one selected a group consisting of a gravel-sprayed technique and chemical etching.

18. The method of claim 12, wherein said undoped active layer comprises a material of AlGaInP.

19. The method of claim 18, wherein said AlGaInP comprises an $((Al_xGa_{1-x})_yIn_{1-y}P)$ compound material $0 \leq x \leq 1$ and $0 \leq y \leq 1$.

20. The method of claim 12, wherein said transparent substrate is the one selected a group consisting of glass, sapphire and GaP which are visible in the range of visible light.

* * * * *